United States Patent
Kumar et al.

(10) Patent No.: US 9,559,727 B1
(45) Date of Patent: Jan. 31, 2017

(54) STOPPING RULES FOR TURBO PRODUCT CODES

(71) Applicant: SK hynix memory solutions inc., San Jose, CA (US)

(72) Inventors: Naveen Kumar, San Jose, CA (US); Zheng Wu, San Jose, CA (US); Jason Bellorado, San Jose, CA (US)

(73) Assignee: SK hynix memory solutions Inc., San Jose, CA (US)

( * ) Notice: Subject to any disclaimer, the term of this patent is extended or adjusted under 35 U.S.C. 154(b) by 75 days.

(21) Appl. No.: 14/720,566

(22) Filed: May 22, 2015

Related U.S. Application Data

(60) Provisional application No. 62/025,939, filed on Jul. 17, 2014.

(51) Int. Cl.
*H03M 13/03* (2006.01)
*H03M 13/29* (2006.01)

(52) U.S. Cl.
CPC ..... *H03M 13/2975* (2013.01); *H03M 13/2948* (2013.01); *H03M 13/2963* (2013.01)

(58) Field of Classification Search
CPC .............. H03M 13/2948; H03M 13/2963; H03M 13/2975
See application file for complete search history.

(56) References Cited

U.S. PATENT DOCUMENTS

| | | | |
|---|---|---|---|
| 5,185,746 A | 2/1993 | Tanaka et al. | |
| 5,333,143 A | 7/1994 | Blaum et al. | |
| 5,428,627 A | 6/1995 | Gupta | |
| 7,107,505 B2* | 9/2006 | Thesling, III | H03M 13/2742 714/701 |
| 8,572,460 B2* | 10/2013 | Wang | H04L 1/005 714/758 |
| 8,850,296 B2* | 9/2014 | Weingarten | G06F 11/1068 714/781 |
| 2008/0163033 A1 | 7/2008 | Yim | |
| 2014/0129899 A1 | 5/2014 | Kumar et al. | |
| 2014/0164866 A1 | 6/2014 | Bolotov et al. | |

OTHER PUBLICATIONS

Al Dweik et al., A hybrid decoder ofr block turbo codes, May 2009, IEEE Trans. on Comm. vol. 57, No. 5, pp. 1229-1232.*
Obiedat et al., Distributed turbo product codes over multiple relays, 2010, IEEE, pp. 1-5.*

* cited by examiner

*Primary Examiner* — Shelly A Chase
(74) *Attorney, Agent, or Firm* — IP & T Group LLP

(57) ABSTRACT

Row decoding is performed on row codewords in an array in order to produce a row decoded array that includes row decoded column codewords. Column decoding is performed on the row decoded column codewords in order to produce a row and column decoded array that includes row and column decoded row codewords and row and column decoded column codewords. The number of row and column decoded row codewords that are not in a row codebook is determined and the number of row and column decoded column codewords that are not in a column codebook are determined. If the number not in the row codebook equals 0 and the number not in the column codebook equals 1, at least a data portion of the row and column decoded array is output.

17 Claims, 10 Drawing Sheets

Row-Decoded Array (222)

| $b_0^r$ | $b_1^r$ | ... | $b_{k-2}^r$ | $b_{k-1}^r$ | Row 0 Parity |
| --- | --- | --- | --- | --- | --- |
| $b_k^r$ | $b_{k+1}^r$ | ... | $b_{2k-2}^r$ | $b_{2k-1}^r$ | Row 1 Parity |
| $b_{2k}^r$ | $b_{2k+1}^r$ | ... | $b_{3k-2}^r$ | $b_{3k-1}^r$ | Row 2 Parity |
| ⋮ | ⋮ | ⋱ | ⋮ | ⋮ | ⋮ |
| $b_{(R-1)k}^r$ | $b_{(R-1)k+1}^r$ | ... | $b_{Rk-2}^r$ | $b_{Rk-1}^r$ | Row (R-1) Parity |
| Column 0 Parity | ... | | Column C-1 Parity | | Parity on Row Parity |

Row-decoded Column Codewords (224)

⇩ After Column Decoding

Row-decoded and Column-decoded Array (242)

| $b_0^{rc}$ | $b_1^{rc}$ | ... | $b_{k-2}^{rc}$ | $b_{k-1}^{rc}$ | Row 0 Parity$^{rc}$ |
| --- | --- | --- | --- | --- | --- |
| $b_k^{rc}$ | $b_{k+1}^{rc}$ | ... | $b_{2k-2}^{rc}$ | $b_{2k-1}^{rc}$ | Row 1 Parity$^{rc}$ |
| $b_{2k}^{rc}$ | $b_{2k+1}^{rc}$ | ... | $b_{3k-2}^{rc}$ | $b_{3k-1}^{rc}$ | Row 2 Parity$^{rc}$ |
| ⋮ | ⋮ | ⋱ | ⋮ | ⋮ | ⋮ |
| $b_{(R-1)k}^{rc}$ | $b_{(R-1)k+1}^{rc}$ | ... | $b_{Rk-2}^{rc}$ | $b_{Rk-1}^{rc}$ | Row (R-1) Parity$^{rc}$ |
| Column 0 Parity$^c$ | ... | | Column C-1 Parity$^c$ | | Parity on Row Parity$^c$ |

Row-decoded and Column-decoded Column Codewords (244)    Row-decoded and Column-decoded Row Codewords (246)

FIG. 2B

STOPPING RULES FOR TURBO PRODUCT CODES

CROSS REFERENCE TO OTHER APPLICATIONS

This application claims priority to U.S. Provisional Patent Application No. 62/025,939 entitled ERROR FLOOR REDUCTION FOR TURBO PRODUCT CODES filed Jul. 17, 2014 which is incorporated herein by reference for all purposes.

BACKGROUND OF THE INVENTION

Turbo product codes (TPC) are a type of code where the data is arranged in an array (e.g., k bits wide and R bits high) prior to encoding. During the encoding process, a first code is applied in the horizontal direction to produce row parity information. Typically, but not always, the height of each row is 1 bit. A second code is then applied in the vertical direction (including on the row parity information) to produce column parity information. In some embodiments, the width of each column is two or more bits. The performance of TPC systems eventually hits an error floor as the bit error rate goes down. New techniques which push the error floor down further would be desirable.

BRIEF DESCRIPTION OF THE DRAWINGS

Various embodiments of the invention are disclosed in the following detailed description and the accompanying drawings.

FIG. 2B is a diagram illustrating an embodiment of a row-decoded and column-decoded array that results from column decoding.

DETAILED DESCRIPTION

The invention can be implemented in numerous ways, including as a process; an apparatus; a system; a composition of matter; a computer program product embodied on a computer readable storage medium; and/or a processor, such as a processor configured to execute instructions stored on and/or provided by a memory coupled to the processor. In this specification, these implementations, or any other form that the invention may take, may be referred to as techniques. In general, the order of the steps of disclosed processes may be altered within the scope of the invention. Unless stated otherwise, a component such as a processor or a memory described as being configured to perform a task may be implemented as a general component that is temporarily configured to perform the task at a given time or a specific component that is manufactured to perform the task. As used herein, the term 'processor' refers to one or more devices, circuits, and/or processing cores configured to process data, such as computer program instructions.

A detailed description of one or more embodiments of the invention is provided below along with accompanying figures that illustrate the principles of the invention. The invention is described in connection with such embodiments, but the invention is not limited to any embodiment. The scope of the invention is limited only by the claims and the invention encompasses numerous alternatives, modifications and equivalents. Numerous specific details are set forth in the following description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured.

Figure 1:
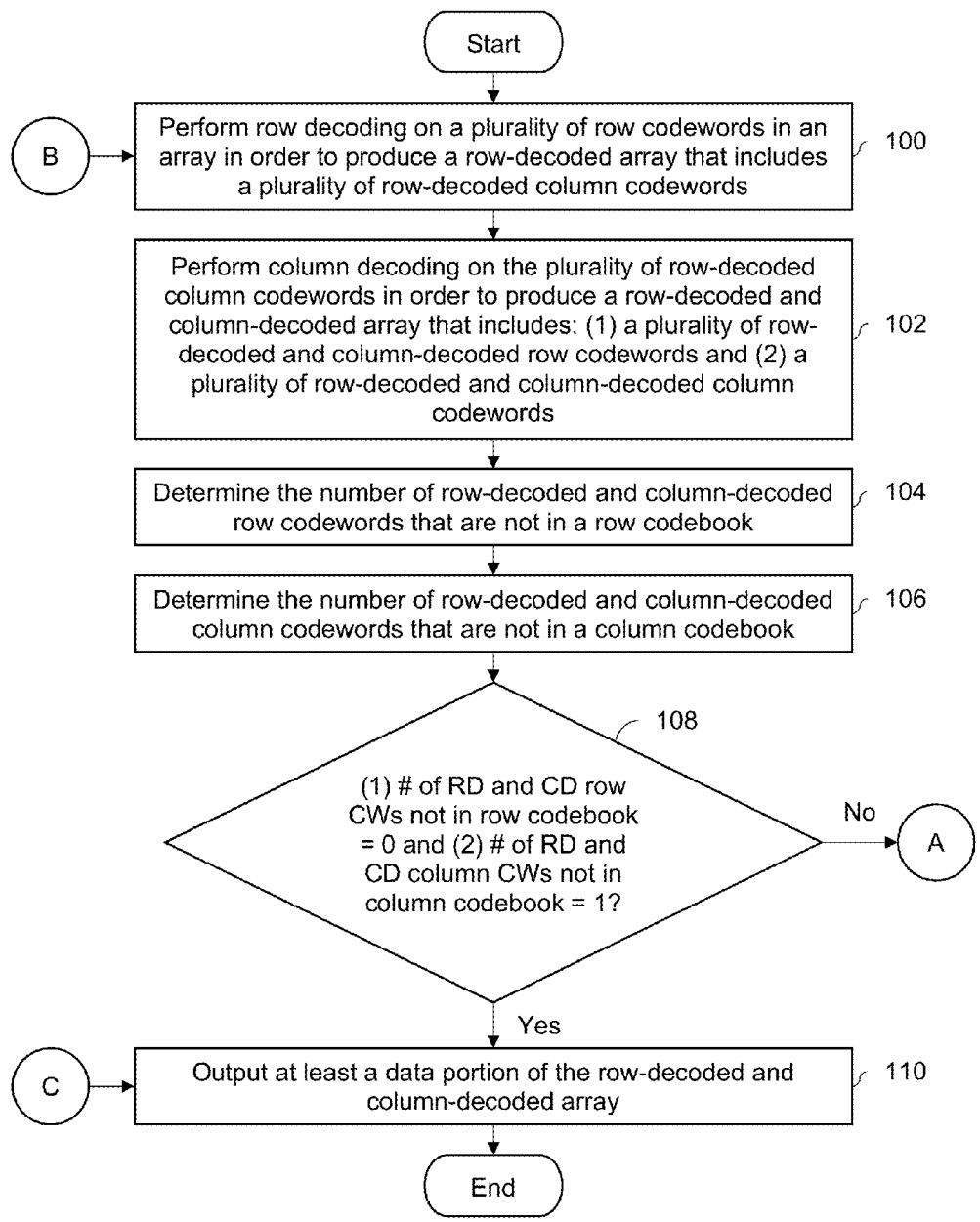
FIG. 1 is a flowchart illustrating an embodiment of a turbo product code (TPC) stopping rule where a single invalid column codeword is permitted.

FIG. 1 is a flowchart illustrating an embodiment of a turbo product code (TPC) stopping rule where a single invalid column codeword is permitted. In the example shown, the process is performed by a read processor, for example, which is part of a storage controller that reads data from and writes data to storage using a TPC code. The storage controller may include a read processor which performs read-related operations on the storage and a write processor which performs write-related operations on the storage. In some embodiments, a storage controller is a semiconductor device (such as an application-specific integrated circuit (ASIC) or a field-programmable gate array (FPGA)) and thus the process is performed by a semiconductor.

At 100, row decoding is performed on a plurality of row codewords in an array in order to produce a row-decoded array that includes a plurality of row-decoded column codewords. As used herein, a codeword refers to a bit sequence that has been processed using a code of the relevant type. For example, a column codeword refers to a bit sequence that has been encoded using a column code, and a row codeword refers to a bit sequence that has been encoded using a row code. As the term is used herein, not all codewords are members of a codebook. For example, a row or column error correction encoding process outputs only codewords from the row codebook or the column codebook; a corresponding row or column error correction decoding process attempts to map a received codeword (e.g., with noise and/or errors) to one of the codewords from the row or column codebook. A codeword that is not in a codebook is sometimes referred to herein as an invalid codeword.

Figure 2A:
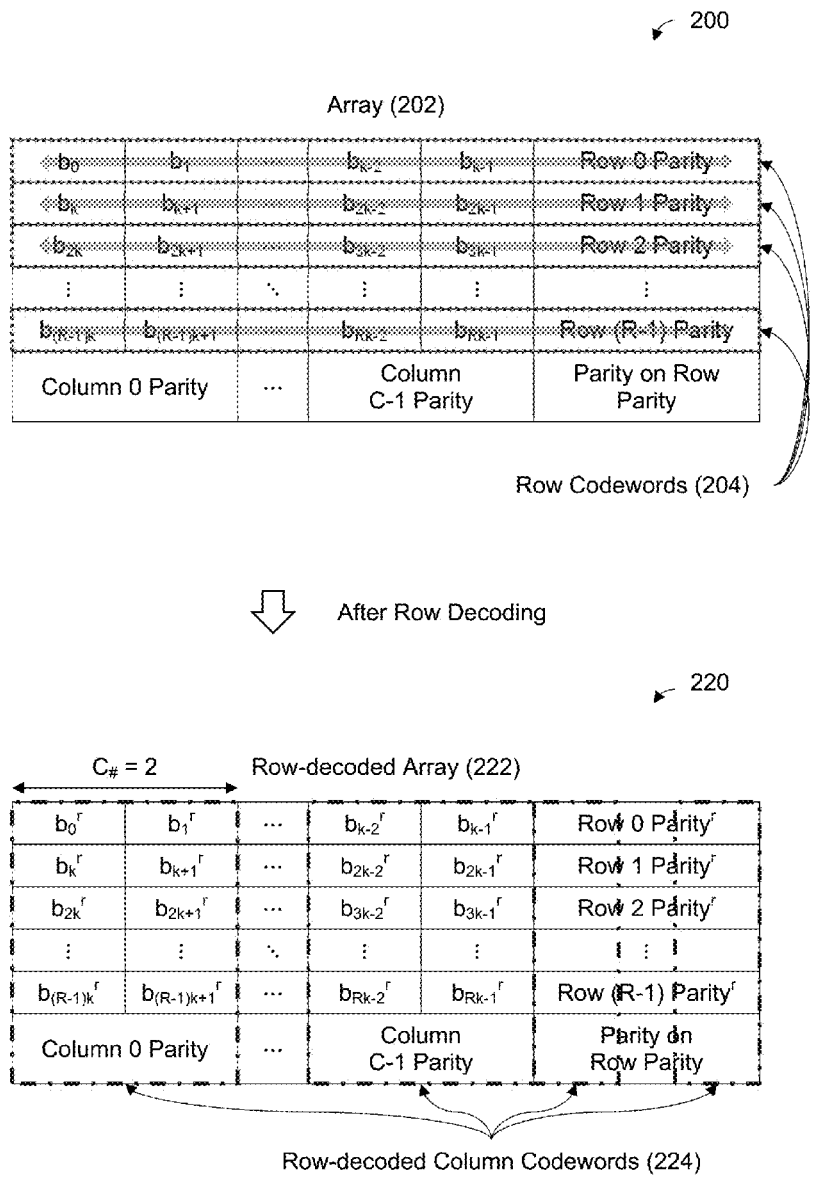
FIG. 2A is a diagram illustrating an embodiment of an array before and after row decoding.

FIG. 2A is a diagram illustrating an embodiment of an array before and after row decoding. In the example shown, diagram 200 shows an array before row decoding (i.e., error correction decoding in the horizontal direction) is performed. In the state shown therein, array 202 includes row codewords 204. In this example there are R row codewords, where each row codeword includes k bits of data, plus some number of row parity bits generated using a row code (sometimes referred to herein as a first code). Note that row decoding is not performed on the column parity information, since that information was not error correction encoded using the row code. In some embodiments, a row code is a BCH code and row decoding includes performing BCH decoding.

Diagram 220 shows the array after row decoding and row-decoded array 222 is an example of a row-decoded array generated at step 100 of FIG. 1. To indicate that row decoding has been performed on row-decoded array 222 (with the exception of the column parity information, which was not row decoded), the data and row parity information are shown with a superscript "$^r$" in row-decoded array 222.

Row-decoded array 222 includes row-decoded column codewords 224. In this example, each column codeword is 2 bits/columns wide (i.e., $C_\#=2$, where $C_\#$ is the number of bits/columns combined together to generate a column codeword). As will be described in more detail below, when the TPC code used satisfies a certain condition related to $C_\#$, the stopping rule shown in FIG. 1 can guarantee with a very high degree of certainty that a miscorrection will not occur with the stopping rule shown.

Returning to FIG. 1, at 102, column decoding is performed on the plurality of row-decoded column codewords in order to produce a row-decoded and column-decoded array that includes: (1) a plurality of row-decoded and column-decoded row codewords and (2) a plurality of row-decoded and column-decoded column codewords. In some embodiments, a column code is a BCH code and performing column decoding at step 102 includes performing BCH decoding. BCH codes are merely exemplary and any type of code may be used for a row code and/or a column code.

FIG. 2B is a diagram illustrating an embodiment of a row-decoded and column-decoded array that results from column decoding. FIG. 2B continues the example shown in FIG. 2A. Diagram 220 in FIG. 2B shows the row-decoded array (222) before column decoding (i.e., error correction decoding in the vertical direction) is performed on the row-decoded column codewords (224).

Diagram 240 shows the resulting row-decoded and column-decoded array (242), which is one example of such an array generated at step 102 in FIG. 1. Array 242 includes row-decoded and column-decoded column codewords (244) and row-decoded and column-decoded row codewords (246). In diagram 240, a superscript "$^c$" is used to indicate which bits have had column decoding performed on them. In this particular example, all bits are column decoded. Note that some bits are only column decoded in diagram 240 (e.g., the column parity information has only a "$^c$" marking in diagram 240) and other bits are both column decoded and row decoded (e.g., the data and row parity information have an "$^{rc}$" marking in diagram 240).

Returning to FIG. 1, at 104 the number of row-decoded and column-decoded row codewords that are not in a row codebook is determined. For example, in diagram 240 of FIG. 2B, step 104 would determine the number of row codewords 246 which are not in the row codebook.

At 106, the number of row-decoded and column-decoded column codewords that are not in a column codebook is determined. In diagram 240 of FIG. 2B, for example, step 106 would determine the number of column codewords 244 which are not in the column codebook.

At 108, it is determined if the number of row-decoded and column-decoded row codewords not in the row codebook equals 0 and if the number of row-decoded and column-decoded column codewords not in the column codebook equals 1. If so, at least a data portion of the row-decoded and column-decoded array is output at 110. For example, in diagram 240 in FIG. 2B, the data (comprising the array k bits wide and R bits high beginning from the upper left corner) would be output if the condition were satisfied. Naturally, at step 110, additional information may also be output. For example, at step 110 the whole data may be output, including the row and/or column parity information. In some embodiments, there is a step before step 110, where row and/or column parity information is updated or otherwise generated from the (e.g., updated) data depending upon the 1 row/column failure.

In examples described herein, serial concatenation embodiments are shown but the decoding techniques described herein are not so limited. To put it another way, the decoding techniques described herein also work on parallel concatenation (where there is no parity on parity present). The proposed decoding technique can be applied to serial and parallel concatenation both.

Figure 3:
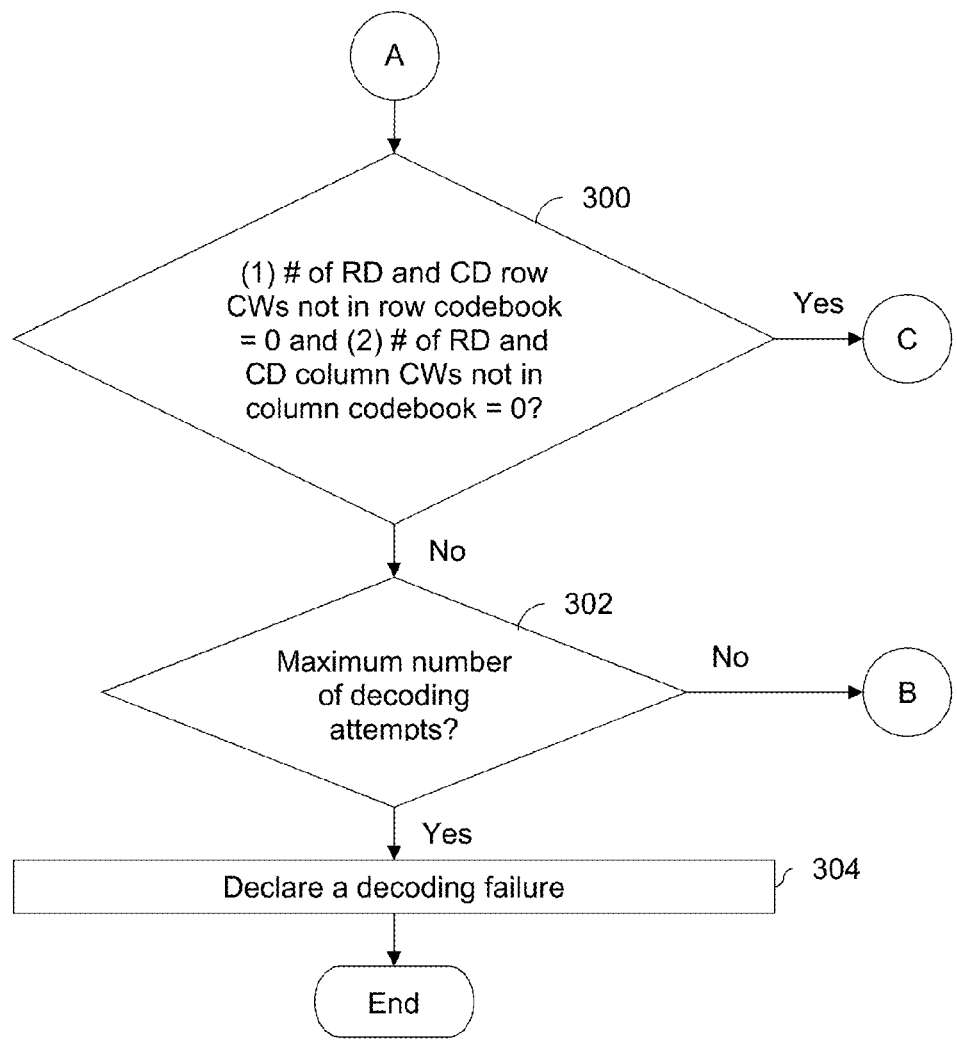
FIG. 3 is a flowchart illustrating an embodiment of additional stopping rules for a TPC decoding process.

FIG. 3 is a flowchart illustrating an embodiment of additional stopping rules for a TPC decoding process. FIG. 3 continues the example of FIG. 1. If the check at step 108 in FIG. 1 is not satisfied, then it is determined at 300 if the number of row-decoded and column-decoded row codewords not in a row codebook equals 0 and the number of row-decoded and column-decoded column codewords not in a column codebook equals 0. If so, at least a data portion of the row-decoded and column-decoded array is output at step 110 in FIG. 1. To put it another way, the check at step 108 in FIG. 1 is one rule and the check at step 300 in FIG. 3 is another (i.e., additional) rule for stopping TPC decoding because decoding has successfully recovered the original data.

If the check at step 300 is not satisfied, it is determined at 302 if a maximum number of decoding attempts has been reached. For example, a TPC decoding controller may track the number of global iterations that haven been performed, where a global iteration includes a pass of row decoding and a pass of column decoding. If it is determined at step 302 that the number of global iterations has reached some maximum (as an example), then a decoding failure is declared at step 304. If it is determined that the maximum number of decoding attempts has not yet been reached at step 302, then row decoding is performed on the row codewords at step 100 in FIG. 1. The row codewords and array at this pass or iteration of step 100 are from the last pass or iteration of column decoding and row decoding. In some embodiments, the row and/or column parity information is updated using the updated or error corrected data portion (as or if needed) before the next round of row decoding at step 100 and column decoding at step 102.

Figure 4:
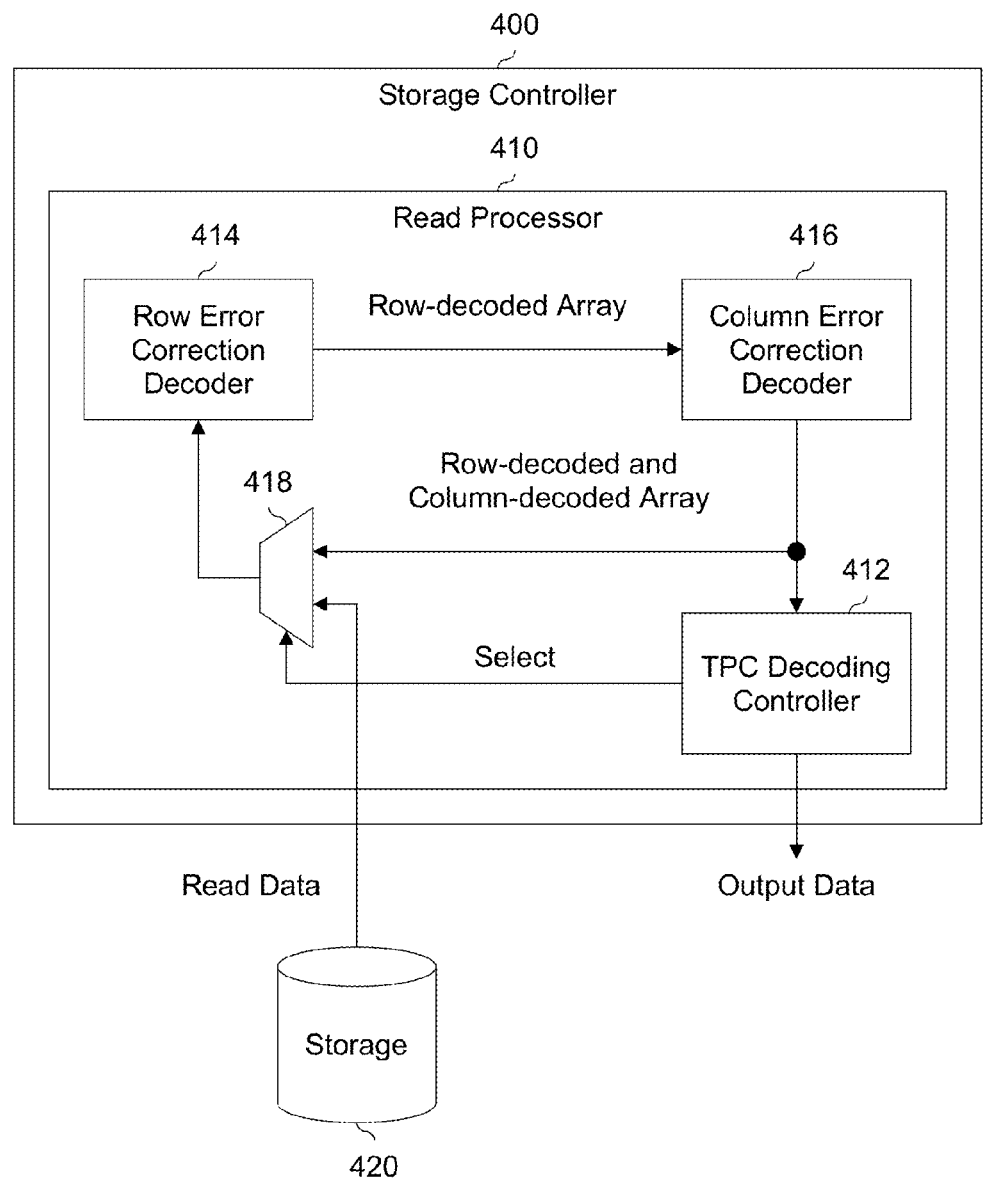
FIG. 4 is a diagram illustrating an embodiment of a storage controller which uses a TPC code to store information.

FIG. 4 is a diagram illustrating an embodiment of a storage controller which uses a TPC code to store information. In the example shown, storage controller 400 includes read processor 410, which is one example of a system which performs the process of FIGS. 1 and 3. In some embodiments, storage controller 400 is a semiconductor device. For clarity, some components which are not directly related to the TPC stopping technique described herein (e.g., a write processor) are not shown in FIG. 4.

Row error correction decoder 414 is one example of a component which performs row decoding at step 100 in FIG. 1. During a first iteration, the data processed by row error correction decoder 414 is obtained from storage 420. So that the proper data is input to decoder 414 during this first iteration, TPC decoding controller 412 outputs a select signal which causes multiplexer 418 to select the read data from storage 420 and not the row-decoded and column-decoded array from column error correction decoder 416. In various embodiments, storage 420 may comprise a variety of storage, such as solid state storage or hard disk drive storage.

Row error correction decoder 414 outputs a row-decoded array and passes it to column error correction decoder 416. Column error correction decoder 416 is one example of a component that performs column decoding at step 102 in FIG. 1.

The row-decoded and column-decoded array that is output by column error correction decoder 416 is passed to TPC decoding controller 412. TPC decoding controller 412 determines the number of column codewords and row codewords that are not in the column codebook and row codebook, respectively. If the stopping rule described in step 108 in FIG. 1 is satisfied, or the stopping rule described in step 300 in FIG. 3 is satisfied, then the data portion (at least) of the row-decoded and column-decoded array is output and a decoding success is declared. As described above, in some embodiments, additional information such as the row and/or column parity information is also output. If needed, the row and/or column parity information is updated before being output. If the maximum number of decoding attempts is reached at step 302 in FIG. 3, then decoding stops but no data is output.

If neither of the stopping rules described in step 108 in FIG. 1 or step 300 in FIG. 3 is satisfied and the maximum number of attempts is not reached at step 302, then another global iteration is performed. At such a second or later iteration, TPC decoding controller 412 outputs a select signal which causes multiplexer 418 to select the row-decoded and column-decoded array from column decoder 416, causing that array (and not the read data from storage 420) to be passed to row decoder 414.

Returning to FIG. 1, the stopping rule described therein came about because of close examinations of the error patterns that remained when a TPC array failed to decode (e.g., when a maximum number of global iterations was reached). It was noted that in many cases, the erroneous bits occurred only in the column parity bits, not in the data, so in those cases outputting the decoded data would have been fine since none of the bit errors occurred in the data.

The reasons why bit errors may be more likely to occur in the column parity bits as opposed to other parts of the TPC array are more readily apparent when the portions of the TPC array that are row-encoded and column-encoded are considered. For example, consider array 202 (i.e., before any decoding is performed) shown in FIG. 2A. The column parity information is only protected by the column code, whereas all other bits are protected by both the row code and the column code. This can also be observed in diagram 240 in FIG. 2B. Note that the column parity information is only error correction decoded using the column code (note the superscript "$^c$"), whereas the other bits are error correction decoded using both the column code and the row code (note the superscript "$^{rc}$"). Thus, stopping when all of the row codewords are in the row codebook and (only) one of the column codewords is not in the codebook may be able to catch a few cases where the only bit errors are located in the column parity bits. This enables the TPC error floor to be pushed down further.

In contrast, some other techniques will only stop TPC decoding and output the data if all row codewords are in the row codebook and all column codewords are in the column codebook. However, such systems may be overly cautious and declare a TPC decoding failure even for cases where the bit error(s) are entirely contained in the column parity information and the data is error-free. Such systems will have an error floor that is higher than when the stopping rule described herein is used.

Although the stopping rule described in FIG. 1 may be perfectly acceptable to use in some applications, in some other applications it may be desirable to have stronger guarantees with respect to miscorrections. The following figures describe an example where specific types of TPC codes (e.g., that satisfy certain criteria) reduce the likelihood of a miscorrection from occurring compared to the general embodiment described in FIG. 1. First, an example of a miscorrection is described.

Figure 5:
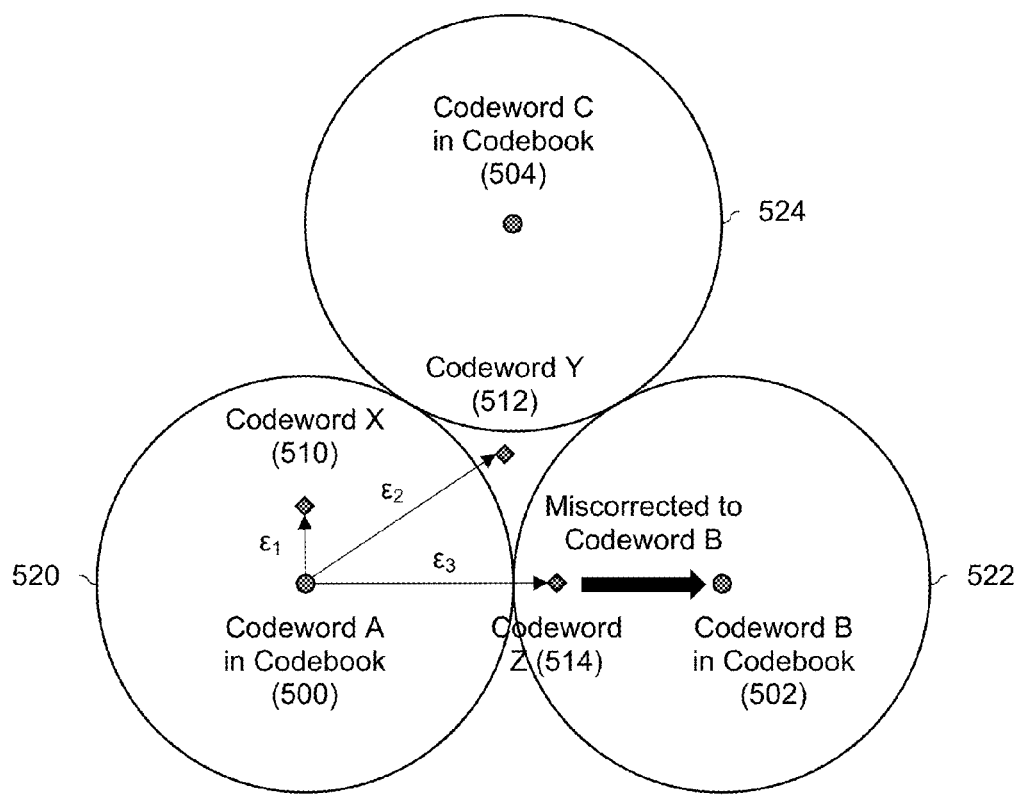
FIG. 5 is a diagram illustrating an embodiment of a miscorrection.

FIG. 5 is a diagram illustrating an embodiment of a miscorrection. In the example shown, codewords A (500), B (502), and C (504) are in a codebook (e.g., a column codebook or a row codebook). Codewords X (510), Y (512), and Z (514), on the other hand, are not in the codebook.

In this example, codeword A is stored in storage. While being stored and/or while being read back from the storage process, errors are introduced. Codewords X (510), Y (512), and Z (514) show codeword A when affected by various bit error sequences (e.g., codeword X=codeword A+$\epsilon_1$, where $\epsilon_1$ is a first bit error sequence; codeword Y=codeword A+$\epsilon_2$, where $\epsilon_2$ is a second bit error sequence; codeword Z=codeword A+$\epsilon_3$, where $\epsilon_3$ is a third bit error sequence).

Decoding spheres 520, 522, and 524 conceptually illustrate the decoding process performed by an error correction decoder (e.g., a row decoder or a column decoder in a TPC decoder). The radius of each sphere corresponds to the error correction capability of the particular code. For example, if a code is able to correct up to 3 bits, then each of spheres 520, 522, and 524 would have a radius of 3. For codewords that do not fall into any of the spheres, such as codeword Y (512), the decoder declares a decoding failure. For example, $\epsilon_2$ may contain 4 bit errors, which is beyond the error correction capability of the exemplary code described above.

For codewords that fall within a sphere, the decoder selects and outputs the codeword at the center of that sphere as the decoded data. In the case of codeword X (510), this is fine since the codeword that is output (i.e., codeword A (500)) matches the originally-stored data. However, in the case of codeword Z (514), the decoder will decode it to codeword B (502) which does not match the originally-stored data. Worse yet, the decoder cannot differentiate between the decoding scenarios illustrated by codewords X (510) and Z (514) and thus is unable to tell that anything is wrong. The decoding scenario illustrated by codeword Z (514) is referred to as a miscorrection.

Using the stopping rule described in FIG. 1 may introduce more miscorrections into a TPC system (e.g., compared to when the stopping rule described in FIG. 1 is not used). As described above, there is a subset of TPC codes which reduces the likelihood of a miscorrection. The following figures show some embodiments of this.

Figure 6:
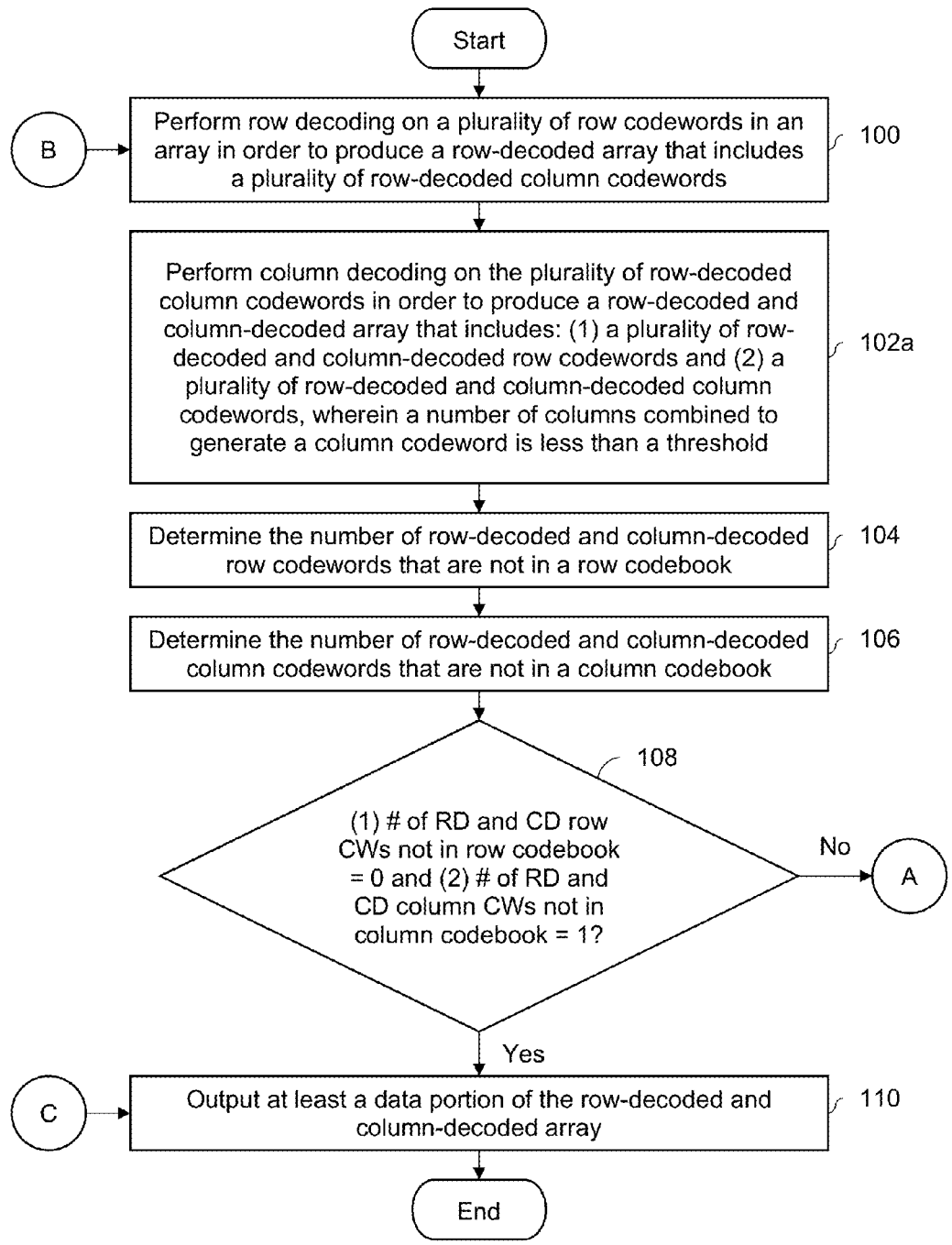
FIG. 6 is a flowchart illustrating an embodiment of a TPC stopping rule which uses certain kinds of TPC codes in order to reduce the likelihood of a miscorrection.

FIG. 6 is a flowchart illustrating an embodiment of a TPC stopping rule which uses certain kinds of TPC codes in order to reduce the likelihood of a miscorrection. FIG. 6 is similar to FIG. 1. For brevity, identical steps (indicated by the same reference number) which were already described above are not described again here.

At step 102a, column decoding is performed on the plurality of row-decoded column codewords in order to produce a row-decoded and column-decoded array that includes: (1) a plurality of row-decoded and column-decoded row codewords and (2) a plurality of row-decoded and column-decoded column codewords, wherein a number of columns combined to generate a column codeword is less than a threshold. For example, the threshold may be set to the minimum distance of a row code. By using a row code and a column code where the number of columns combined to generate a column codeword (i.e., $C_\#$) is (strictly) less than the minimum distance of a row code, this reduces the likelihood that a miscorrection will occur. The following figure illustrates this.

Figure 7:
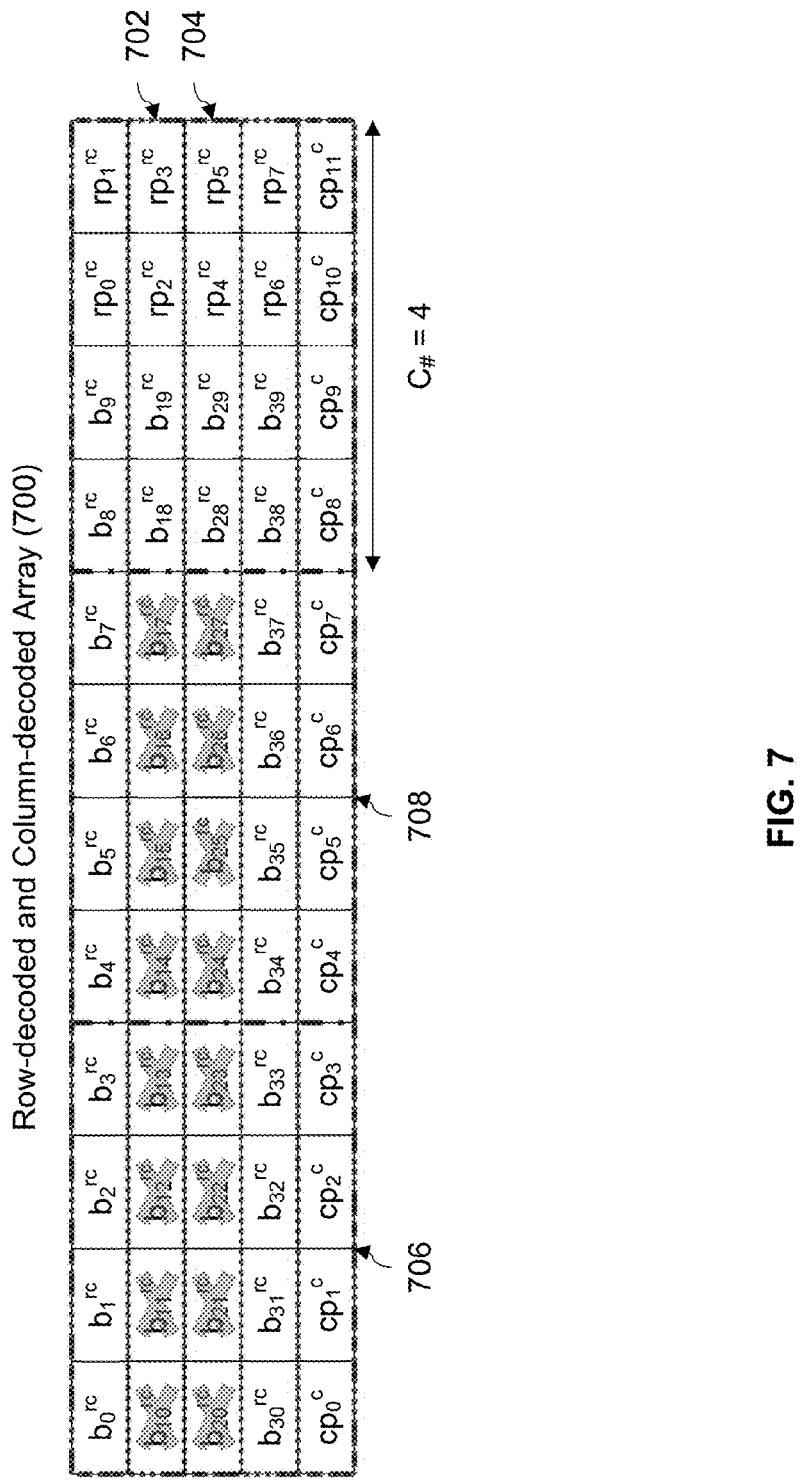
FIG. 7 is a diagram illustrating an embodiment of a row-decoded and column-decoded array where the number of columns combined to generate a column codeword is less than the minimum distance of a row code.

FIG. 7 is a diagram illustrating an embodiment of a row-decoded and column-decoded array where the number of columns combined to generate a column codeword is less than the minimum distance of a row code. Row-decoded and column-decoded array 700 is one example of an array that satisfies the row code and column code characteristics described at step 102a in FIG. 6 and also satisfies the check at step 108.

In this particular example, four bits or columns are combined to create one column codeword (i.e., $C_\#=4$). Also in this example, the error correction capability of the row code is 3, as is the column code, (i.e., $T_r=3$ and $T_c=3$), meaning that the row (column) code is able to correct a given row (column) codeword so long as that row (column) codeword has 3 or fewer errors. The minimum distance is related to the error correction capability (at least in this example) by the relationship $d_{min}=2T_r+1$ so that for $T_r=3$, $d_{min}=7$. Since in this example $C_\#=2$ and $d_{min}=7$, the TPC code satisfies the characteristic described at step 102a in FIG. 6.

One cause for concern about the stopping rule described herein is the possibility of miscorrection. In this example, row codeword 702, row codeword 704, column codeword 706, and column codeword 708 each have 8 bit errors. Row codeword 702 and row codeword 704 have miscorrected to a row codeword in the row codebook (albeit not to the correct or proper row codewords). In this example, further suppose that column codeword 706 is miscorrecting (to a column codeword in the column codebook, albeit not the correct or proper one), whereas column codeword 708 is failing error correction encoding.

However, in order for this scenario to occur, row codewords 702 and 704 would have to miscorrect and column codeword 706 would also have to miscorrect. The probability of a single miscorrection is quiet low, and so the probability of three miscorrections occurring at the same time is even smaller. Thus, using a TPC code that has the characteristic $C_\#<2T_r+1$ ensures that the miscorrection probability is even lower than when an unconstrained TPC code is used.

In some cases, it may be desirable to use a TPC code where the condition $C_\#<2T_r+1$ is not met (i.e., $C_\#>2T_r+1$). The following figures describe an embodiment where such a TPC code may be used, but measures are taken to reduce the likelihood of a miscorrection from occurring.

Figure 8:
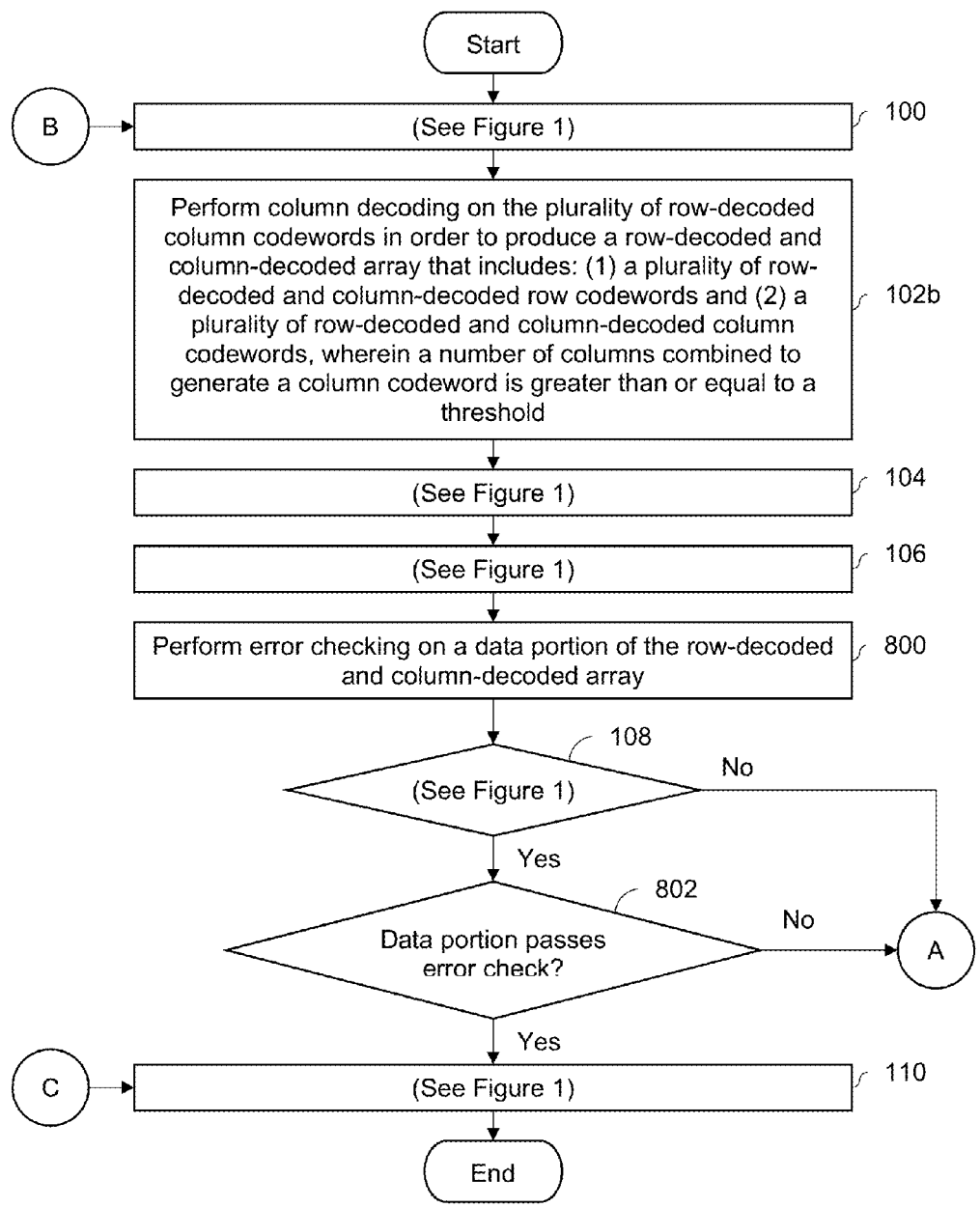
FIG. 8 is a flowchart illustrating an embodiment of a TPC stopping rule where an error check is applied to the data portion of the TPC array.

FIG. 8 is a flowchart illustrating an embodiment of a TPC stopping rule where an error check is applied to the data portion of the TPC array. In the example shown, a TPC code is used where $C_\#\geq 2T_r+1$, so the probability of a miscorrection is not automatically reduced as is the case when $C_\#<2T_r+1$ for the reasons described above. To reduce the likelihood of a miscorrection being introduced when $C_\#\geq 2T_r+1$, an error check is applied to the data portion of the TPC array. For example, a cyclic redundancy check (CRC) or a parity bit may be used. Due to space limitations, steps that are identical to those shown in FIG. 1 are not repeated in their entirety in FIG. 8.

At 100, row decoding is performed on a plurality of row codewords in an array in order to produce a row-decoded array that includes a plurality of row-decoded column codewords.

At 102b, column decoding is performed on the plurality of row-decoded column codewords in order to produce a row-decoded and column-decoded array that includes: (1) a plurality of row-decoded and column-decoded row codewords and (2) a plurality of row-decoded and column-decoded column codewords, wherein a number of columns combined to generate a column codeword is greater than or equal to a threshold. In some embodiments, the threshold is equal to the minimum distance of a row code or is based on the minimum distance in some other manner. For example, $C_\#\geq 2T_r+1$.

At 104, the number of row-decoded and column-decoded row codewords that are not in a row codebook is determined. At 106, the number of row-decoded and column-decoded column codewords that are not in a column codebook is determined.

At 800, error checking is performed on a data portion of the row-decoded and column-decoded array. For a given code rate, an error detection code is able to detect more erroneous bits than a corresponding error correction code is able to fix. For this reason (and because the error checking at step 800 is used primarily as part of the stopping rule), in some embodiments, an error detection code is used at step 800. In one example, a parity check is performed where a parity is calculated from the read-back data portion and the calculated parity is compared to the read-back parity bit. In another example, a CRC check is performed, where a checksum is calculated from the read-back data portion and the calculated checksum is compared to the read-back checksum.

At 108, it is determined if (1) the number of row-decoded and column-decoded row codewords not in a row codebook equals 0 and (2) the number of row-decoded and column-decoded column codewords not in a column codebook equals 1. If so, it is determined at 802 if the data portion of the row-decoded and column-decoded array passes the error check. If so, at least the data portion of the row-decoded and column-decoded array is output at 110. If not, the process goes from step 802 to step 300 in FIG. 3. To put it another way, one of the ways in which TPC decoding can end successfully is if the data portion passes the error check at 108 and a (as an example) CRC check at step 802. If there are no invalid row codewords, only a single invalid column codeword, but the data portion does not pass the error check at 802, then the data portion is not output at step 110 in this example. Performing a CRC check (or other error check) at step 802 only if step 108 is first satisfied may be attractive because then the CRC check does not need to be unnecessarily performed too soon.

In some embodiments, the CRC bits (as an example) are generated before row encoding or column encoding is performed (e.g., as opposed to performing row encoding and column encoding first, and then generating the CRC bits on the data portion). For example, a 4K data chunk is received and a CRC check is computed on this 4K data. In this example, the CRC bits are 15 bits long and TPC encoding is subsequently performed on the (4K+15) data length. This way, the CRC bits are doubly protected using the row code and column code. In this way, the CRC bits will be correct with high probability, significantly reducing the likelihood of a miscorrection. If CRC bits were not included in the data portion (and thus were not protected using the column code and row code), the CRC bits would not be as trustworthy.

The performance of this CRC check scheme (especially with respect to the introduction of miscorrections, which may be an important concern for some applications) may depend upon the protection of the CRC bits.

The following figure shows a simulation when a CRC code is applied to the data portion of a TPC array. As will be shown in the following figure, the applying a CRC code or other error check to the user portion of a TPC array reduces the likelihood of a miscorrection and thus reduces the error floor.

It is noted that although FIG. 8 shows an error check being applied to the data portion of a TPC array and $C_\# \geq 2T_r+1$, the combination of these two elements is not required. To put it another way, an error check may be applied to the data portion of a TPC array even for those cases where $C_\# < 2T_r+1$.

Figure 9:
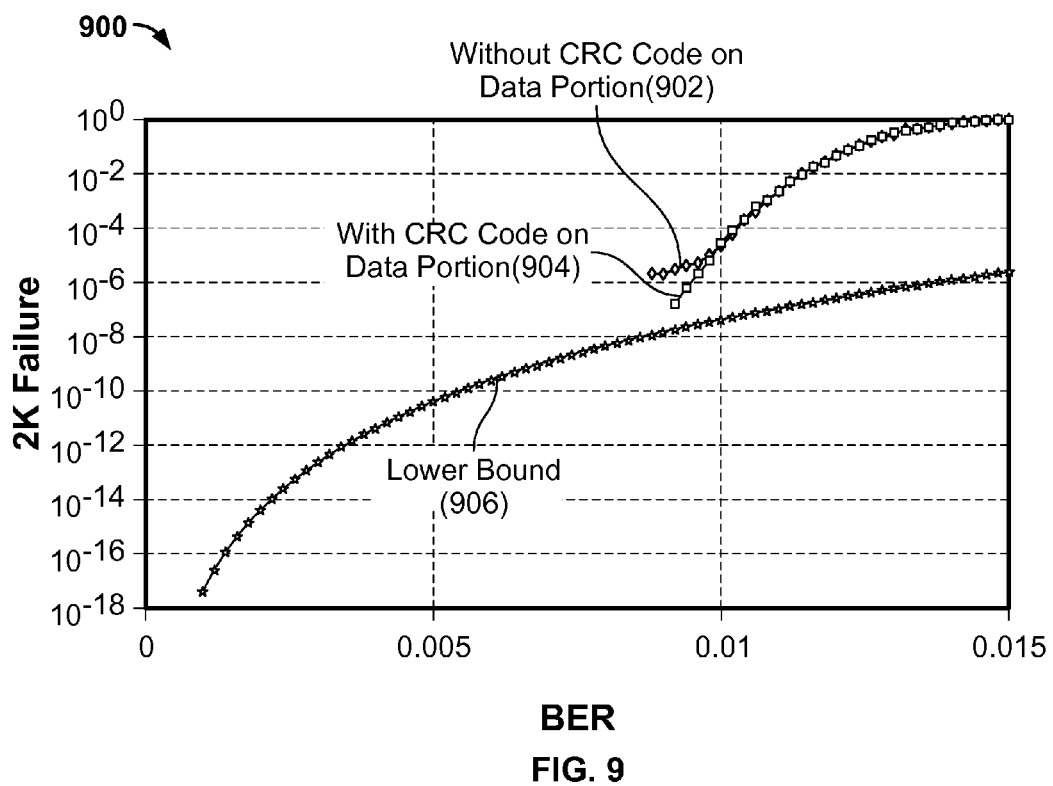
FIG. 9 is a diagram illustrating an embodiment of a simulation result when a CRC code is applied to a data portion of a TPC array.

FIG. 9 is a diagram illustrating an embodiment of a simulation result when a CRC code is applied to a data portion of a TPC array. In the example shown, the following parameters are used in a simulation to obtain graph 900.

TPC data size: 2 KB
Row Code: (nr, kr, Tr, mr)=(1001, 911, 9, 1024)
Column Code: (nc, kc, Tc, mc)=(991, 901, 9, 1024)
CRC Code=(16399, 16384, 1, 32768)

With the CRC code described above, only 15 bits of overhead are required, which is a relatively small amount of overhead information. Curve 902 shows the performance when there is no CRC code applied to the data portion of the TPC array. Curve 904 shows the performance when the above CRC code is applied to the data portion of the TPC array. To provide some context, the analytical lower bound (906) is also shown. As can be seen in graph 900, the error floor is reduced by over 2 orders of magnitude using only 15 additional overhead bits.

Although the foregoing embodiments have been described in some detail for purposes of clarity of understanding, the invention is not limited to the details provided. There are many alternative ways of implementing the invention. The disclosed embodiments are illustrative and not restrictive.

What is claimed is:

1. A system, comprising:
   a row decoder configured to perform row decoding on a plurality of row codewords in an array in order to produce a row-decoded array that includes a plurality of row-decoded column codewords;
   a column decoder configured to perform column decoding on the plurality of row-decoded column codewords in order to produce a row-decoded and column-decoded array that includes: (1) a plurality of row-decoded and column-decoded row codewords and (2) a plurality of row-decoded and column-decoded column codewords; and
   a turbo product code (TPC) decoding controller configured to:
      determine a number of row-decoded and column-decoded row codewords that are not in a row codebook;
      determine a number of row-decoded and column-decoded column codewords that are not in a column codebook; and
      output at least a data portion of the row-decoded and column-decoded array in the event: (1) the number of row-decoded and column-decoded row codewords not in the row codebook equals 0 and (2) the number of row-decoded and column-decoded column codewords not in the column codebook equals 1.

2. The system of claim 1, wherein the system includes a semiconductor device, including one or more of the following: an application-specific integrated circuit (ASIC) or a field-programmable gate array (FPGA).

3. The system of claim 1, wherein the TPC decoding controller is further configured to output at least the data portion of the row-decoded and column-decoded array in the event: (1) the number of row-decoded and column-decoded row codewords not in the row codebook equals 0 and (2) the number of row-decoded and column-decoded column codewords not in the column codebook equals 0.

4. The system of claim 3, wherein:
   the system further includes a multiplexer that is configured to select between (1) read data from storage and (2) the row-decoded and column-decoded array output by the column decoder, wherein the row decoder inputs output of the multiplexer; and
   the TPC decoding controller is further configured to:
      determine if a maximum number of decoding attempts has been reached;
      in the event it is determined that the maximum number of decoding attempts has been reached, declare a decoding failure; and
      in the event it is determined that the maximum number of decoding attempts has not been reached, configure the multiplexer to select the row-decoded and column-decoded array output by the column decoder, wherein the row decoder performs row decoding on the plurality of row codewords in the row-decoded and column-decoded array.

5. The system of claim 1, wherein a number of columns combined to generate a column codeword is less than a threshold.

6. The system of claim 1, wherein the TPC decoding controller is further configured to:
   perform error checking on a data portion of the row-decoded and column-decoded array;
   output at least the data portion of the row-decoded and column-decoded array in the event: (1) the number of row-decoded and column-decoded row codewords not in the row codebook equals 0, (2) the number of row-decoded and column-decoded column codewords not in the column codebook equals 1, and (3) the data portion passes the error check; and
   not output the data portion of the row-decoded and column-decoded array in the event: (1) the number of row-decoded and column-decoded row codewords not in the row codebook equals 0, (2) the number of row-decoded and column-decoded column codewords not in the column codebook equals 1, and (3) the data portion does not pass the error check.

7. The system of claim 6, wherein a number of columns combined to generate a column codeword is greater than or equal to a threshold.

8. The system of claim 6, wherein:
   the plurality of row codewords include cyclic redundancy check (CRC) bits such that the row decoder is configured to perform row decoding on the CRC bits; and
   the plurality of column codewords include the CRC bits such that the column decoder is configured to perform column decoding on the CRC bits.

9. A method, comprising:
performing row decoding on a plurality of row codewords in an array in order to produce a row-decoded array that includes a plurality of row-decoded column codewords;
performing column decoding on the plurality of row-decoded column codewords in order to produce a row-decoded and column-decoded array that includes: (1) a plurality of row-decoded and column-decoded row codewords and (2) a plurality of row-decoded and column-decoded column codewords;
determining a number of row-decoded and column-decoded row codewords that are not in a row codebook;
determining a number of row-decoded and column-decoded column codewords that are not in a column codebook; and
outputting at least a data portion of the row-decoded and column-decoded array in the event: (1) the number of row-decoded and column-decoded row codewords not in the row codebook equals 0 and (2) the number of row-decoded and column-decoded column codewords not in the column codebook equals 1.

10. The method of claim 9, wherein the method is performed by a semiconductor device, including one or more of the following: an application-specific integrated circuit (ASIC) or a field-programmable gate array (FPGA).

11. The method of claim 9, wherein the TPC decoding controller is further configured to output at least the data portion of the row-decoded and column-decoded array in the event: (1) the number of row-decoded and column-decoded row codewords not in the row codebook equals 0 and (2) the number of row-decoded and column-decoded column codewords not in the column codebook equals 0.

12. The method of claim 11, further comprising:
selecting between (1) read data from storage and (2) the row-decoded and column-decoded array output by the column decoder, wherein the row decoder inputs output of the multiplexer;
determining if a maximum number of decoding attempts has been reached;
in the event it is determined that the maximum number of decoding attempts has been reached, declaring a decoding failure; and
in the event it is determined that the maximum number of decoding attempts has not been reached, configuring the multiplexer to select the row-decoded and column-decoded array output by the column decoder, wherein the row decoder performs row decoding on the plurality of row codewords in the row-decoded and column-decoded array.

13. The method of claim 9, wherein a number of columns combined to generate a column codeword is less than a threshold.

14. The method of claim 9, wherein the TPC decoding controller is further configured to:
performing error checking on a data portion of the row-decoded and column-decoded array;
outputting at least the data portion of the row-decoded and column-decoded array in the event: (1) the number of row-decoded and column-decoded row codewords not in the row codebook equals 0, (2) the number of row-decoded and column-decoded column codewords not in the column codebook equals 1, and (3) the data portion passes the error check; and
not outputting the data portion of the row-decoded and column-decoded array in the event: (1) the number of row-decoded and column-decoded row codewords not in the row codebook equals 0, (2) the number of row-decoded and column-decoded column codewords not in the column codebook equals 1, and (3) the data portion does not pass the error check.

15. The method of claim 14, wherein a number of columns combined to generate a column codeword is greater than or equal to a threshold.

16. The method of claim 14, wherein:
the plurality of row codewords include cyclic redundancy check (CRC) bits such that the row decoder is configured to perform row decoding on the CRC bits; and
the plurality of column codewords include the CRC bits such that the column decoder is configured to perform column decoding on the CRC bits.

17. A computer program product, the computer program product being embodied in a non-transitory computer readable storage medium and comprising computer instructions for:
performing row decoding on a plurality of row codewords in an array in order to produce a row-decoded array that includes a plurality of row-decoded column codewords;
performing column decoding on the plurality of row-decoded column codewords in order to produce a row-decoded and column-decoded array that includes: (1) a plurality of row-decoded and column-decoded row codewords and (2) a plurality of row-decoded and column-decoded column codewords;
determining a number of row-decoded and column-decoded row codewords that are not in a row codebook;
determining a number of row-decoded and column-decoded column codewords that are not in a column codebook; and
outputting at least a data portion of the row-decoded and column-decoded array in the event: (1) the number of row-decoded and column-decoded row codewords not in the row codebook equals 0 and (2) the number of row-decoded and column-decoded column codewords not in the column codebook equals 1.

* * * * *